United States Patent [19]
Shin et al.

[11] Patent Number: 6,075,390
[45] Date of Patent: Jun. 13, 2000

[54] KEY INTERFACE CIRCUIT WITH REDUCED NUMBER OF INPUT TERMINALS

[75] Inventors: Yasuhiro Shin; Teruyuki Fujii, both of Tokyo, Japan

[73] Assignee: Oki Electric Industry Co., Ltd., Tokyo, Japan

[21] Appl. No.: 09/069,941

[22] Filed: Apr. 30, 1998

[30] Foreign Application Priority Data

May 21, 1997 [JP] Japan .................................. 9-131348

[51] Int. Cl.[7] ...................................................... H03K 5/22
[52] U.S. Cl. ............................ 327/74; 327/403; 327/407
[58] Field of Search ................................ 327/74, 75, 76, 327/403, 404, 405, 407, 408, 411, 415, 417, 395, 379

[56] References Cited

U.S. PATENT DOCUMENTS

| | | | |
|---|---|---|---|
| 4,740,966 | 4/1988 | Goad | 327/407 |
| 5,396,245 | 3/1995 | Rempfer | 341/145 |
| 5,568,070 | 10/1996 | Osaki et al. | 327/408 |
| 5,703,505 | 12/1997 | Kwon | 327/75 |

*Primary Examiner*—Kenneth B. Wells
*Assistant Examiner*—An T. Luu
*Attorney, Agent, or Firm*—Venable; Robert J. Frank; Jeffrey W. Gluck

[57] ABSTRACT

A static key interface circuit has an input terminal coupled to N key switches, where N is an integer greater than one. The N key switches are biased at different potentials, which are supplied to the input terminal when the key switches are closed. A multilevel detector in the key interface circuit detects the potential of the input terminal and generates corresponding result data. A dynamic key interface circuit has an input terminal coupled to P rows of N key switches each and scans the P rows in turn, using a similar multilevel detector. The multilevel detector increases the number of key switches connectable to a single input terminal by a factor of N.

15 Claims, 7 Drawing Sheets

FIG.3

| INPUT TERMINAL POTENTIAL | RESULT SIGNALS | | |
|---|---|---|---|
| | $ID_1$ | $ID_2$ | $ID_3$ |
| $V_{DD}$ | L | L | L |
| $V_1$ | H | L | L |
| $V_2$ | H | H | L |
| $V_3$(GND) | H | H | H |

FIG.4

| RESULT SIGNALS | | | RESULT DATA | | |
|---|---|---|---|---|---|
| $ID_1$ | $ID_2$ | $ID_3$ | $QD_1$ | $QD_2$ | $QD_3$ |
| L | L | L | L | L | L |
| H | L | L | H | L | L |
| H | H | L | L | H | L |
| H | H | H | L | L | H |

FIG.5

| INPUT TERMINAL POTENTIAL | INTERVAL | RESULT DATA | | |
|---|---|---|---|---|
| | | $S_{i1}$ | $S_{i2}$ | $S_{i3}$ |
| $V_{DD}$ | $>V_A$ | L | L | L |
| $V_1$ | $V_A \sim V_B$ | H | L | L |
| $V_2$ | $V_B \sim V_C$ | L | H | L |
| $V_3$ | $<V_C$ | L | L | H |

KEY INTERFACE CIRCUIT WITH REDUCED NUMBER OF INPUT TERMINALS

BACKGROUND OF THE INVENTION

The present invention relates to a key interface circuit, more particularly to a key interface circuit with a reduced number of input terminals.

Keyboards and keypads are in widespread use in electronic apparatus. Each key on a keyboard or keypad operates a key switch, which closes when the key is depressed. The function of a key interface circuit, which is commonly packaged as a single integrated circuit, is to sense the closing of the key switches and generate corresponding output data signals.

Conventional key interface circuits are of the static type and dynamic type. A conventional static key interface circuit has a separate input terminal coupled to each key switch. When the key switch is open, the input terminal is biased through a resistor to a first potential, such as the power-supply potential. When the key switch is closed, the input terminal is connected through the key switch to a second potential, such as the ground potential. This arrangement produces an input signal that can be directly latched and supplied to other circuits that process the key input data.

A conventional dynamic key interface circuit operates in a generally similar manner, but places the key switches at the nodes of a row-column matrix, connects each column of key switches to a single input terminal of the key interface circuit, and scans the key matrix by driving one row at a time to the second potential.

With a static key interface circuit, there is the problem that the number of input terminals is equal to the number of keys, which may be large. Simply to accommodate the input terminals, the key interface circuit may require a large circuit package, taking up an inconveniently large amount of space. In some cases, two or more key interface circuits may be needed to provide input terminals for all of the key switches. There is also the problem of the large amount of wiring needed to connect each key switch separately to the key interface circuit.

With a dynamic key interface circuit, the number of input terminals and the amount of wiring is reduced, but the key matrix must be scanned at a rapid rate. The scanning pulses become a source of electromagnetic interference to nearby devices such as radio receivers.

SUMMARY OF THE INVENTION

An object of the present invention is to increase the number of key switches that can be connected to a single input terminal of a key interface circuit.

The inventive key interface circuit is coupled to at least N key switches, where N is an integer greater than one. Each key switch has a first terminal and a second terminal. The first terminals of the N key switches are biased at different potentials. The key interface circuit comprises an input terminal coupled in common to the second terminals of all N key switches and a multilevel detector that detects the potential of the input terminal and generates corresponding result data.

A single input terminal of the key interface circuit may be coupled to P rows of N key switches each, where P is also an integer greater than one. In this case, the first terminals of the N key switches in each row are biased at different potentials when a first potential is supplied to the row, and are identically biased when a second potential is supplied to the row. The key interface circuit has a multilevel detector that detects the potential of the input terminal and generates corresponding result data, a row driver that supplies the first and second potentials selectively to the P rows, and a timing generator that generates timing signals by which the row driver is controlled.

Compared with a conventional static or dynamic key interface circuit, the inventive key interface circuit increases the number of key switches connectable to a single input terminal by a factor of N.

BRIEF DESCRIPTION OF THE DRAWINGS

In the attached drawings:

FIG. 3 is a chart illustrating the operation of the comparators in FIG. 2;

FIG. 4 is a chart illustrating the operation of the decoder in FIG. 2;

FIG. 5 is a chart summarizing the operation of the multilevel detector in FIG. 2;

DETAILED DESCRIPTION OF THE INVENTION

Embodiments of the invention will be described with reference to the attached exemplary drawings.

Figure 1:
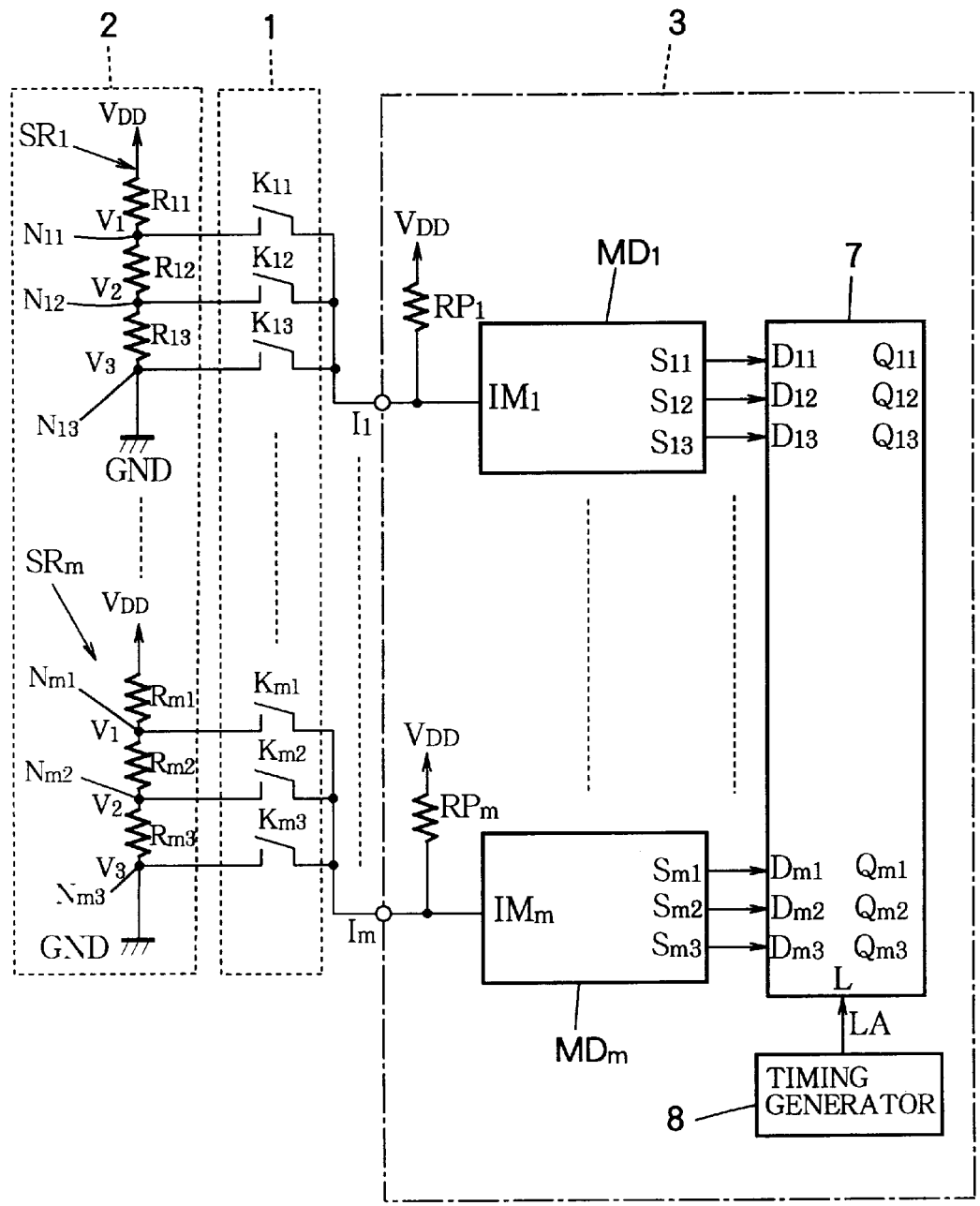
FIG. 1 is a circuit diagram showing a first embodiment of the invention.

FIG. 1 schematically shows a key switch panel 1, which is coupled to a biasing circuit 2 and a static key interface circuit 3. The static key interface circuit 3 is a first embodiment of the present invention.

The key interface circuit 3 has m input terminals $I_1$ to $I_m$, where m is an arbitrary positive integer. Each input terminal $I_i$ ($1 \leq i \leq m$) is coupled to the first terminals (the right-hand terminals in the drawing) of three key switches $K_{i1}$, $K_{i2}$, and $K_{i3}$. The second terminals of key switches $K_{i1}$, $K_{i2}$, and $K_{i3}$ (the left-hand terminals in the drawing) are connected to nodes $N_{i1}$, $N_{i2}$, and $N_{i3}$ in the biasing circuit 2, and are biased at different potentials.

The biasing circuit 2 comprises three times m (3 m) bias resistors, designated $R_{11}$ to $R_{m3}$ in the drawing. Each three bias resistors $R_{i1}$, $R_{i2}$, and $R_{i3}$ are coupled in series between a power-supply node ($V_{DD}$) and a ground node (GND), forming a resistor ladder $SR_i$ that generates three potentials $V_1$, $V_2$, and $V_3$ at respective nodes $N_{i1}$, $N_{i2}$, and $N_{i3}$. Node $N_{i1}$ is disposed between resistors $R_{i1}$ and $R_{i2}$, node $N_{i2}$ between resistors $R_{i2}$ and $R_{i3}$, and node $N_{i3}$ between resistor $R_{i3}$ and ground. All of the bias resistors $R_{11}$ to $R_{m3}$ have equal resistance values, so $V_3$ is equal to the ground potential or zero volts, $V_2$ is equal to $(1/3)V_{DD}$, and $V_1$ is equal to $(2/3)V_{DD}$.

In the key interface circuit 3, the input terminals $I_i$ are coupled through respective pull-nip resistors $RP_i$ to the power-supply potential $V_{DD}$, and are also coupled to respective multilevel detectors $MD_i$ ($1 \leq i \leq m$). The key interface circuit 3 further comprises a latch circuit 7 that receives result data generated by the multilevel detectors $MD_i$, and a timing generator 8 that controls the latch circuit 7.

Figure 2:
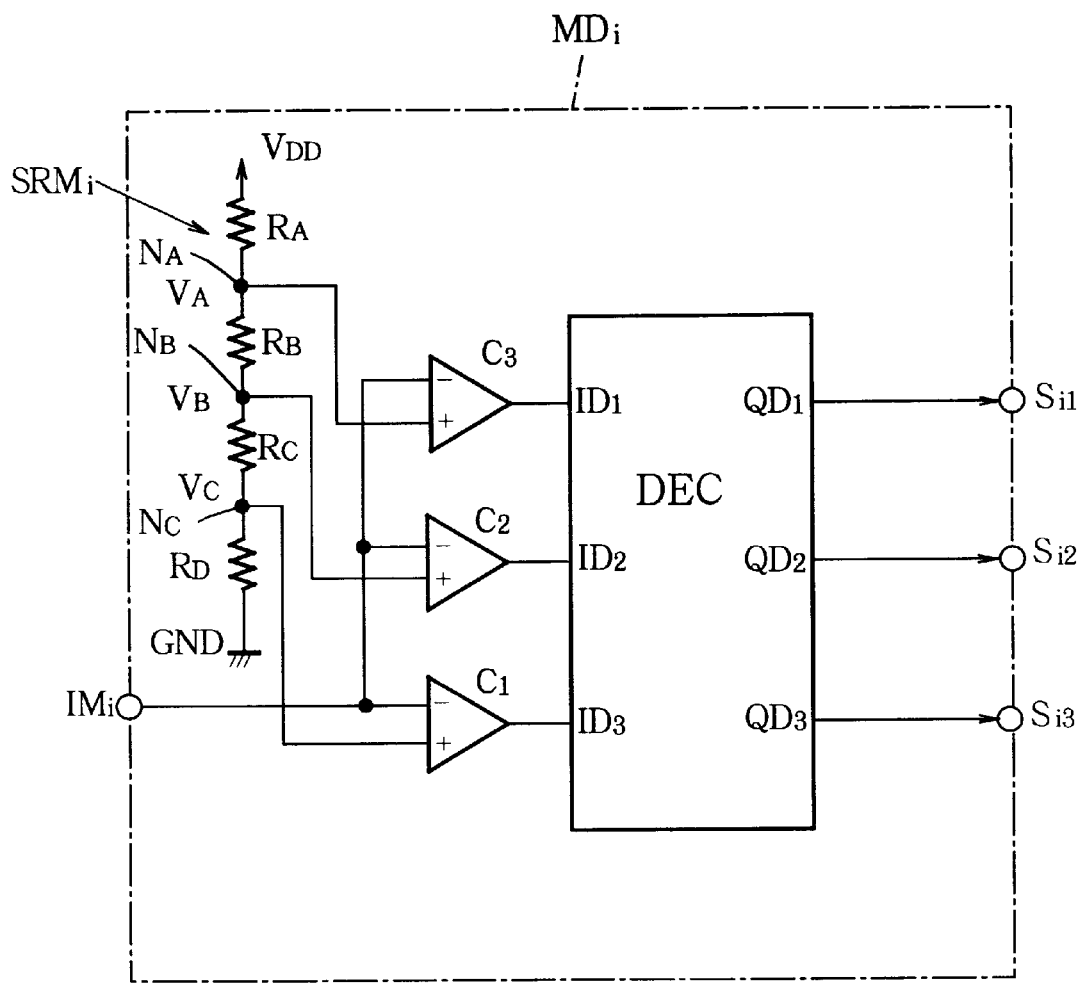
FIG. 2 is a more detailed circuit diagram of one of the multilevel detectors in FIG. 1.

The multilevel detectors $MD_i$ ($1 \leq i \leq m$) have the internal structure shown in FIG. 2. Input node $IM_i$ is coupled to input terminal $I_i$ of the key interface circuit 3, and to the inverting input terminals of three comparators $C_1$, $C_2$, and $C_3$, which constitute a comparing circuit. Resistors $R_A$, $R_B$, $R_C$, and $R_D$ are connected in series between the power-supply potential $V_{DD}$ and ground to form a resistor ladder $SRM_i$ that generates potentials $V_A$, $V_B$, and $V_C$ at nodes $N_A$, $N_B$, and $N_C$, which are coupled to the non-inverting input terminals of respective comparators $C_1$, $C_2$, and $C_3$. The output terminals of comparators $C_1$, $C_2$, and $C_3$ are coupled to respective input terminals $ID_1$, $ID_2$, and $ID_3$ of a decoder (DEC). The decoder has three output terminals $QD_1$, $QD_2$, and $QD_3$, which are coupled to corresponding output nodes $S_{i1}$, $S_{i2}$, and $S_{i3}$ of the multilevel detector $MD_i$.

Each comparator $C_j$ ($1 \leq j \leq 3$) produces a result signal with high and low levels. The high level (equal to $V_{DD}$) is produced when the potential at the non-inverting input terminal is higher than the potential at the inverting input terminal. The low level (ground) is produced when the potential at the non-inverting input terminal is lower than the potential at the inverting input terminal. The decoder (DEC) decodes these result signals, which are received at input terminals $ID_1$, $ID_2$, and $ID_3$, to generate three bits of result data ($QD_1$, $QD_2$, and $QD_3$), among which at most one bit is high.

The resistance values of resistors $R_A$, $R_B$, $R_C$ and $R_D$ must be set so that the potentials generated by resistor ladder $SRM_i$ are related to the potentials generated in the resistor ladder $SR_i$ in the biasing circuit 2 as follows.

$$V_{DD} > V_A > V_1 > V_B > V_2 > V_C > V_3 = GND$$

For example, $R_A$ and $R_D$ may have equal resistance values, and $R_B$ and $R_C$ may both have twice this resistance value.

When key switches $K_{i1}$, $K_{i2}$, and $K_{i3}$ are all open, input terminal $I_i$ of the key interface circuit 3 and input node $IM_i$ of multilevel detector $MD_i$ are pulled up to the power-supply potential $V_{DD}$ through pull-up resistor $RP_i$. When one of the three key switches $K_{i1}$, $K_{i2}$, and $K_{i3}$ is closed, input terminals $I_i$ and $IM_i$ are at a potential substantially equal to one of the potentials $V_1$, $V_2$, and $V_3$. Because of the relationship given above, the comparing circuit comprising the three comparators $C_1$, $C_2$, and $C_3$ operates as indicated in FIG. 3, in which the letters H (high) and L (low) indicate the levels of the result signals output by comparators $C_1$, $C_2$, and $C_3$ and received at input terminals $ID_1$, $ID_2$, and $ID_3$ of the decoder. Specifically, if the potential of the input terminal $I_i$ of the key interface circuit 3 is $V_{DD}$, then $ID_1$, $ID_2$, and $ID_3$ are all low; if the potential of input terminal $I_i$ is $V_1$, then $ID_1$ is high; if the potential of input terminal $I_i$ is $V_2$, then $ID_1$ and $ID_2$ are high; and if the potential of input terminal $I_i$ is $V_3$, then $ID_1$, $ID_2$, and $ID_3$ are all high.

FIG. 4 illustrates the operation of the decoder (DEC) on these four sets of result signals. Reading FIG. 4 from bottom to top, when all three result inputs $ID_1$, $ID_2$, and $ID_3$ are high, result bit $QD_3$ is high. When only $ID_1$ and $ID_2$ are high, result bit $QD_2$ is high. When only $ID_1$ is high, result bit $QD_1$ is high. When all three result inputs $ID_1$, $ID_2$, and $ID_3$ are low, all three bits of result data $QD_1$, $QD_2$, and $QD_3$ are low.

FIG. 5 illustrates the operation of the multilevel detector $MD_i$ as a whole, indicating the four input potentials $V_{DD}$, $V_1$, $V_2$, and $V_3$, the intervals in which these potentials must be located, and the corresponding result data output at nodes $S_{i1}$, $S_{i2}$, and $S_{i3}$, which are the same as the result data $QD_1$, $QD_2$, and $QD_3$ in FIG. 4. The multilevel detector $MD_i$ divides the range from ground to $V_{DD}$ into four intervals, delimited at points $V_A$, $V_B$, and $V_C$, detects the interval in which the potential of the input terminal $I_i$ is disposed, and generates result data identifying the interval.

Referring again to FIG. 1, the latch circuit 7 has three times m (3m) data input terminals, designated $D_{11}$ to $D_{m3}$, a latch pulse input terminal L, and three times m output terminals, designated $Q_{11}$ to $Q_{m3}$. Data input terminal $D_{ij}$ is connected to output node $S_{ij}$ of multilevel detector $MD_i$ ($1 \leq i \leq m$, $1 \leq j \leq 3$). The latch circuit 7 is triggered by rising transitions of the latch pulse signal LA input at terminal L. At each rising transition of LA, the levels of all of the data inputs $D_{ij}$ are latched internally, and the latched levels are output at the corresponding data output terminals $Q_{ij}$ until the next rising transition of LA.

The latch pulse signal LA is generated by the timing generator 8, and alternates between the high and low levels at regular intervals.

Each multilevel detector $MD_i$ can detect the closed state of one of the three key switches $K_{i1}$, $K_{i2}$, and $K_{i3}$ at a time. If two or more of these three key switches are closed simultaneously, only one will be detected as being closed. If $K_{i1}$ and $K_{i2}$ are closed simultaneously, then either $S_{i1}$ or $S_{i2}$ will go high, depending on the exact resistance values of the resistors in the resistor ladders $SR_i$ and $SRM_i$ and the pull-up resistor $RP_i$. If $K_{i3}$ and one or both of $K_{i1}$ and $K_{i2}$ are closed simultaneously, input terminal $I_i$ will be grounded, so $S_{i3}$ will go high.

An example of the operation of the key interface circuit 3 when key switches $K_{i1}$, $K_{i3}$, and $K_{i2}$ are successively closed and opened will be described next.

Figure 6:
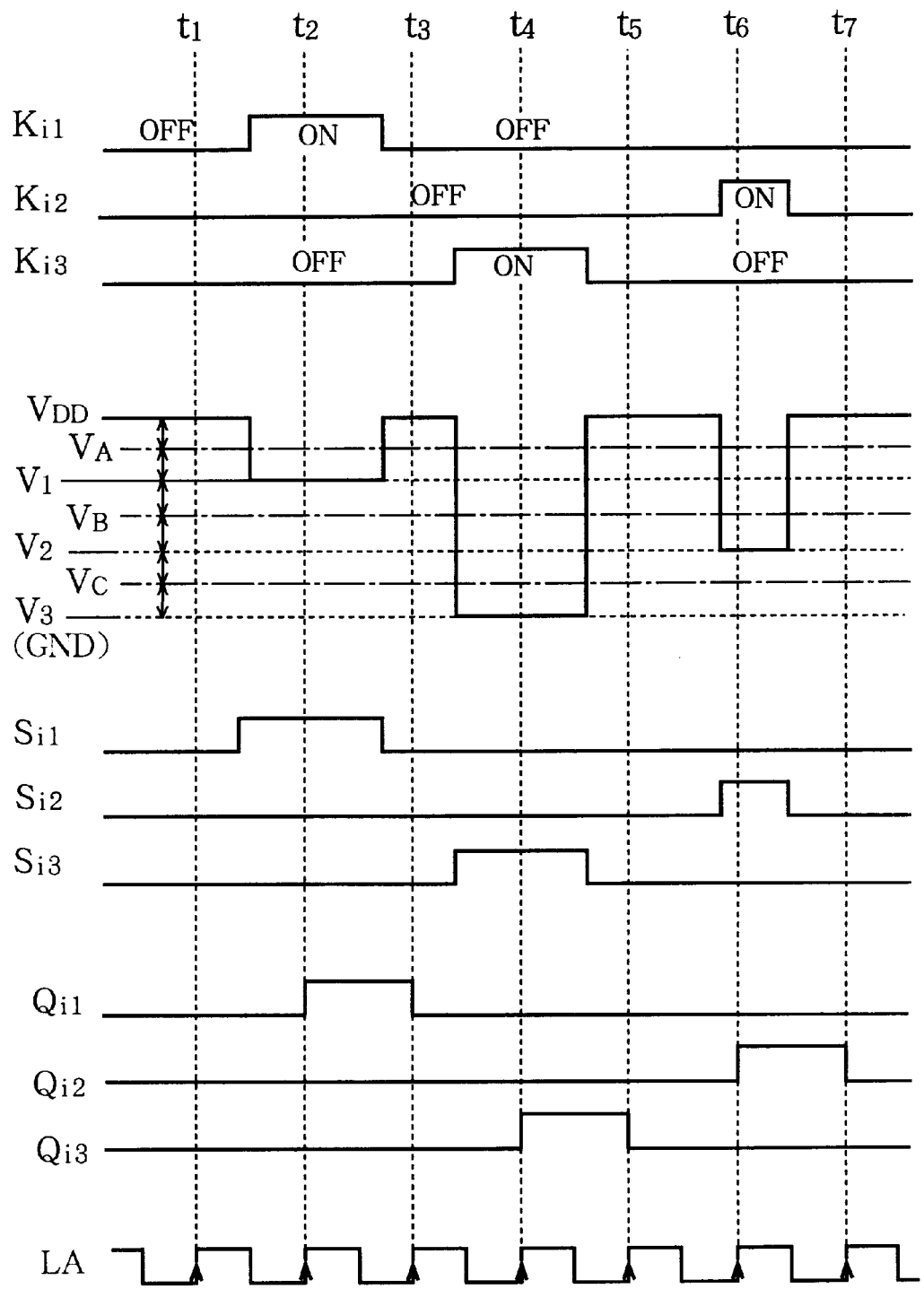
FIG. 6 is a timing diagram illustrating the operation of the first embodiment.

FIG. 6 shows the waveform of the latch pulse signal LA, with rising transitions marked from $t_1$ to $t_7$. FIG. 6 also indicates, from top to bottom, the open (OFF) and closed (ON) states of key switches $K_{i1}$, $K_{i3}$, and $K_{i2}$, the resulting potential at input terminal $I_i$ (a potential from $V_{DD}$ to $V_3$), the result data ($S_{i1}$, $S_{i2}$, $S_{i3}$) generated by multilevel detector $MD_i$, and the corresponding latch output data ($Q_{i1}$, $Q_{i2}$, $Q_{i3}$) provided by the key interface circuit.

Around time $t_1$, all three key switches $K_{i1}$, $K_{i3}$, and $K_{i2}$ are open, so the input terminal $I_i$ is pulled up to $V_{DD}$ through pull-up resistor $RP_i$, and the result data and latch output data are all low.

Key switch $K_{i1}$ is closed at a time between $t_1$ and $t_2$, and opened at a time between $t_2$ and $t_3$. During this interval, the input potential is $V_1$, and result bit $S_{i1}$ goes high. This high result bit is latched by the latch circuit 7 at time $t_2$, causing the corresponding latch output bit $Q_{i1}$ to go high from time $t_2$ to time $t_3$.

At time $t_3$, all three key switches $K_{i1}$, $K_{i2}$, and $K_{i3}$ are again open, so all three result bits $S_{i1}$, $S_{i2}$, and $S_{i3}$ are low. All three latch output bits $Q_{i1}$, $Q_{i2}$, and $Q_{i3}$ are therefore low from time $t_3$ to time $t_4$.

Key switch $K_{i3}$ is closed at; a time between $t_3$ and $t_4$, and opened at a time between $t_4$ and $t_5$. During this interval, the input potential is $V_3$, and result bit $S_{i3}$ goes high. This high result bit is latched at time $t_4$, causing latch output bit $Q_{i3}$ to go high from time $t_4$ to time $t_5$.

At time $t_5$, all three key switches $K_{i1}$, $K_{i2}$, and $K_{i3}$ are once again open, so the three result hits $S_{i1}$, $S_{i2}$, and $S_{i3}$ are again low. The three latch output bits $Q_{i1}$, $Q_{i2}$, and $Q_{i3}$ are low from time $t_5$ to time $t_6$.

Key switch $K_{i2}$ is closed just before time $t_6$, and opened at a time between $t_6$ and $t_7$. During this interval, the input potential is $V_2$, and result bit $S_{i2}$ goes high. This high result bit is latched at time $t_6$, causing latch output, bit $Q_{i2}$ to go high from time $t_6$ to time $t_7$.

At time $t_7$, all three key switches $K_{i1}$, $K_{i2}$, and $K_{i3}$ are open and the three result bits $S_{i1}$, $S_{i2}$, and $S_{i3}$ are all low, so once again the three latch output bits $Q_{i1}$, $Q_{i2}$, and $Q_{i3}$ are all low.

Operations similar to those shown in FIG. 6 can be carried out by each of the m multilevel detectors simultaneously and independently. The m multilevel detectors can thus detect the closed states of tip to m key switches simultaneously, provided no two of these m key switches are coupled to the same multilevel detector. At each rising transition of the latch pulse signal LA, result data representing the states of all of the key switches $K_{i1}$ to $K_{m3}$ are latched in the latch circuit 7. Latch output data for all of the key switches are thus output in synchronization with the latch pulse signal LA.

The data latched in the latch circuit 7 can be output From the key interface circuit 3 in parallel form, or in serial form. Parallel output requires three times m (3 m) output, terminals, whereas serial output requires only one output terminal. Hybrid parallel-serial output schemes can also be used.

Figure 7:
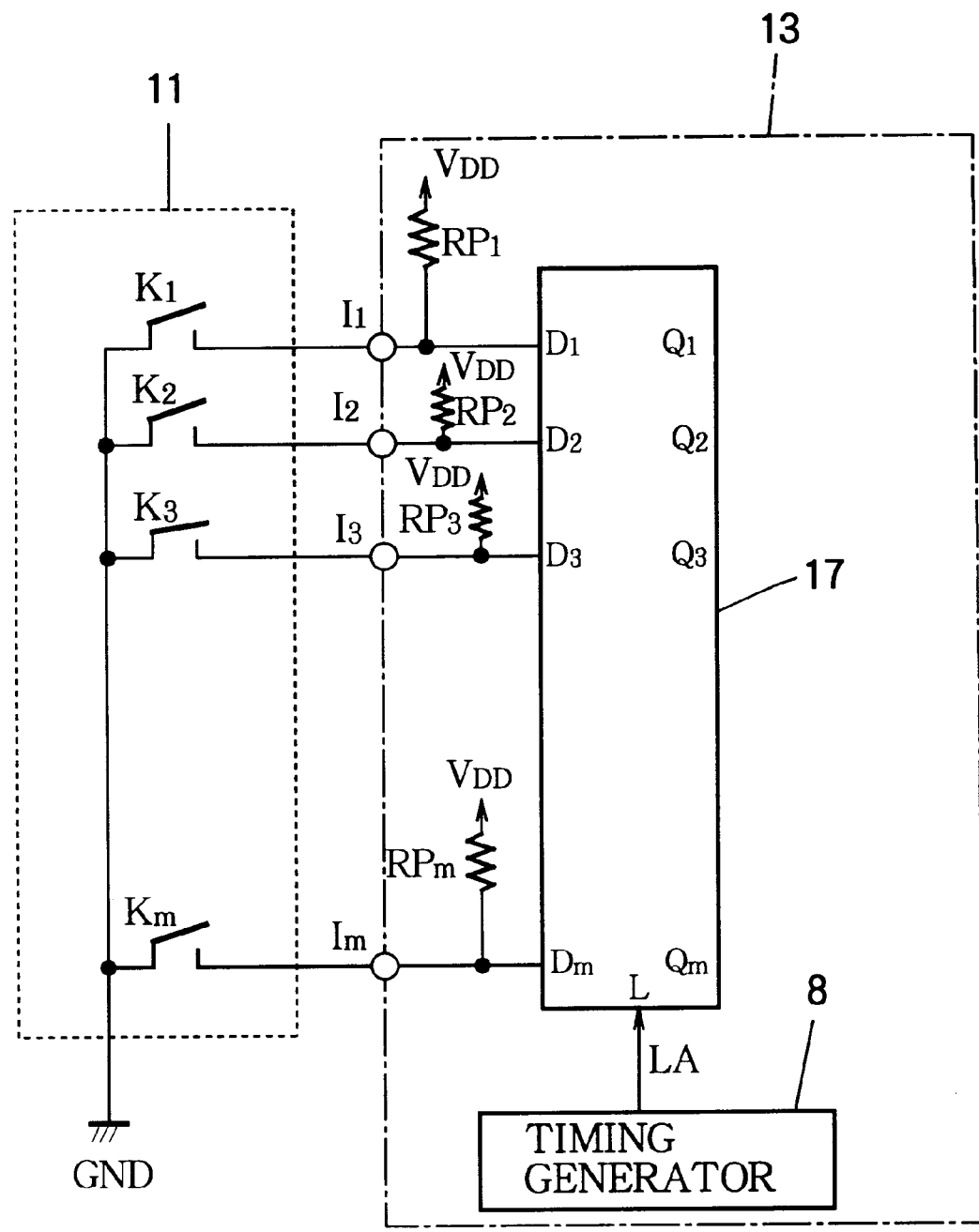
FIG. 7 is a circuit diagram showing a conventional static key interface circuit.

For comparison, FIG. 7 shows a plurality of key switches 11 connected to a conventional static key interface circuit 13 with m input terminals $I_1$ to $I_m$. The conventional static key interface circuit 13 comprises m pull-up resistors $RP_1$ to $RP_m$, a latch circuit 17 with m data input terminals $D_1$ to $D_m$ connected directly to the input terminals $I_1$ to $I_m$ and pull-up resistors $RP_1$ to $RP_m$, and a timing generator 18 that generates a latch pulse signal LA for the latch circuit 17. The first terminals of the key switches $K_1$ to $K_m$ are grounded. The second terminals of the key switches $K_1$ to $K_m$ are coupled to respective input terminals $I_1$ to $I_m$. Only m key switches can be accommodated.

A comparison of FIGS. 1 and 7 shows that the first embodiment increases, by a factor of three, the number of key switches that can be connected to a static key interface circuit with a given number of input terminals. The latch pulse signal LA in the first embodiment is internal to the key interface circuit 3, and does not generate significant electromagnetic interference. The biasing circuit 2 is static in operation, and does not generate any electromagnetic interference. The first embodiment is particularly advantageous in devices, such as certain types of car audio equipment and measuring instruments, that are sensitive to electromagnetic interference and have too many key switches to be accommodated by a conventional static key interface circuit.

Figure 8:
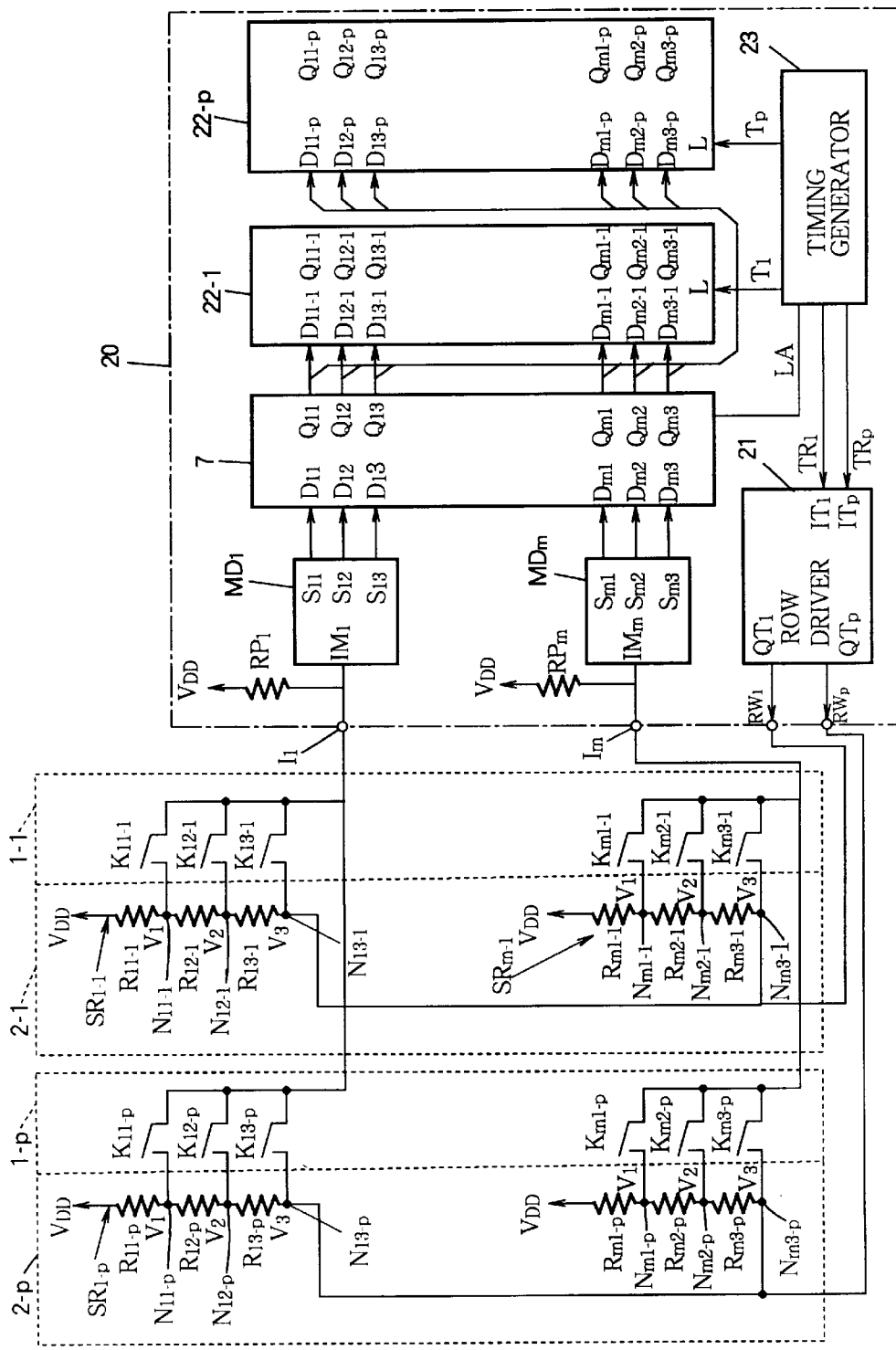
FIG. 8 is a circuit diagram showing a second embodiment of the invention.

FIG. 8 shows a plurality of key switches connected to a dynamic key interface circuit 20, which is a second embodiment of the invention. The dynamic key interface circuit 20 also has m input terminals $I_1$ to $I_m$, but each input terminal is now connected to a matrix of key switches having three columns and p rows, where p is an integer greater than one. Collectively, the m input terminals are connected to a key switch matrix having three times m (3 m) columns and p rows. In the drawing, the rows are vertical and the columns horizontal. The rows are numbered from 1-1 to 1-p. The key switches are designated $K_{ij-k}$, where i and j denote the column, and k denotes the row. Thus $1 \leq i \leq m$ and $1 \leq j \leq 3$, as in the first embodiment, and $1 \leq k \leq p$.

Each row of key switches 1-k is coupled to a biasing circuit 2-k ($1 \leq k \leq p$). Each biasing circuit 2-k is similar to the biasing circuit 2 in the first embodiment, comprising resistors $R_{ij-k}$ connected to form resistor ladders $SR_{i-k}$ with ladder $SR_{i-k}$ with nodes $N_{ij-k}$ ($1 \leq i \leq m$, $1 \leq j \leq 3$), except that instead of being coupled between the power-supply potential $V_{DD}$ and ground, each resistor ladder $SR_{i-k}$ is coupled between $V_{DD}$ and an output terminal $RW_k$ of the key interface circuit 20. When this output terminal $RW_k$ is driven to the low (ground) level, biasing circuit 2-k operates as in the first embodiment, biasing nodes $N_{i1-k}$, $N_{i2-k}$, and $N_{i3-k}$ to potentials $V_1$, $V_2$, and $V_3$. When output terminal $RW_k$ is driven to the high ($V_{DD}$) level, all nodes $N_{ij-k}$ in row 1-k are identically biased at the $V_{DD}$ level.

The key interface circuit 20 comprises pull-up resistors $RP_1$ to $RP_m$, multilevel detectors $MD_1$ to $MD_m$, and a latch circuit 7, which are identical to the corresponding elements in the first embodiment. The key interface circuit 20 also comprises a row driver 21, p sub-latch circuits 22-1 to 22-p, and a timing generator 23, which differs from the timing generator 8 in the first embodiment.

The row driver 21 has input terminals $IT_1$ to $IT_p$ that receive row driving pulse signals $TR_1$ to $TR_p$ from the timing generator 23, and output terminals $QT_1$ to $QT_p$ that drive the above-mentioned output terminals $RW_1$ to $RW_p$ of the key interface circuit 20. Each output terminal $QT_k$ is driven high or low according to whether the corresponding row driving pulse signal $TR_k$ is high or low.

Each sub-latch circuit 22-k is identical to the latch circuit 7, with data input terminals $D_{ij-k}$ coupled to the corresponding data output terminals $Q_{ij}$ of the latch circuit 7. The data output terminals $Q_{ij-k}$ of the sub-latch circuits 22-k can be coupled to data output terminals (not visible) of the key interface circuit 20 in various ways, detailed descriptions of which will be omitted so as not to obscure the invention with irrelevant detail.

The timing generator 23 generates a latch pulse signal LA for the latch circuit 7, generates the row driving pulse signals $TR_1$ to $TR_p$ for the row driver 21, and generates sub-latch pulse signals $T_1$ to $T_p$ for the sub-latch circuits 22-1 to 22-p.

Figure 9:
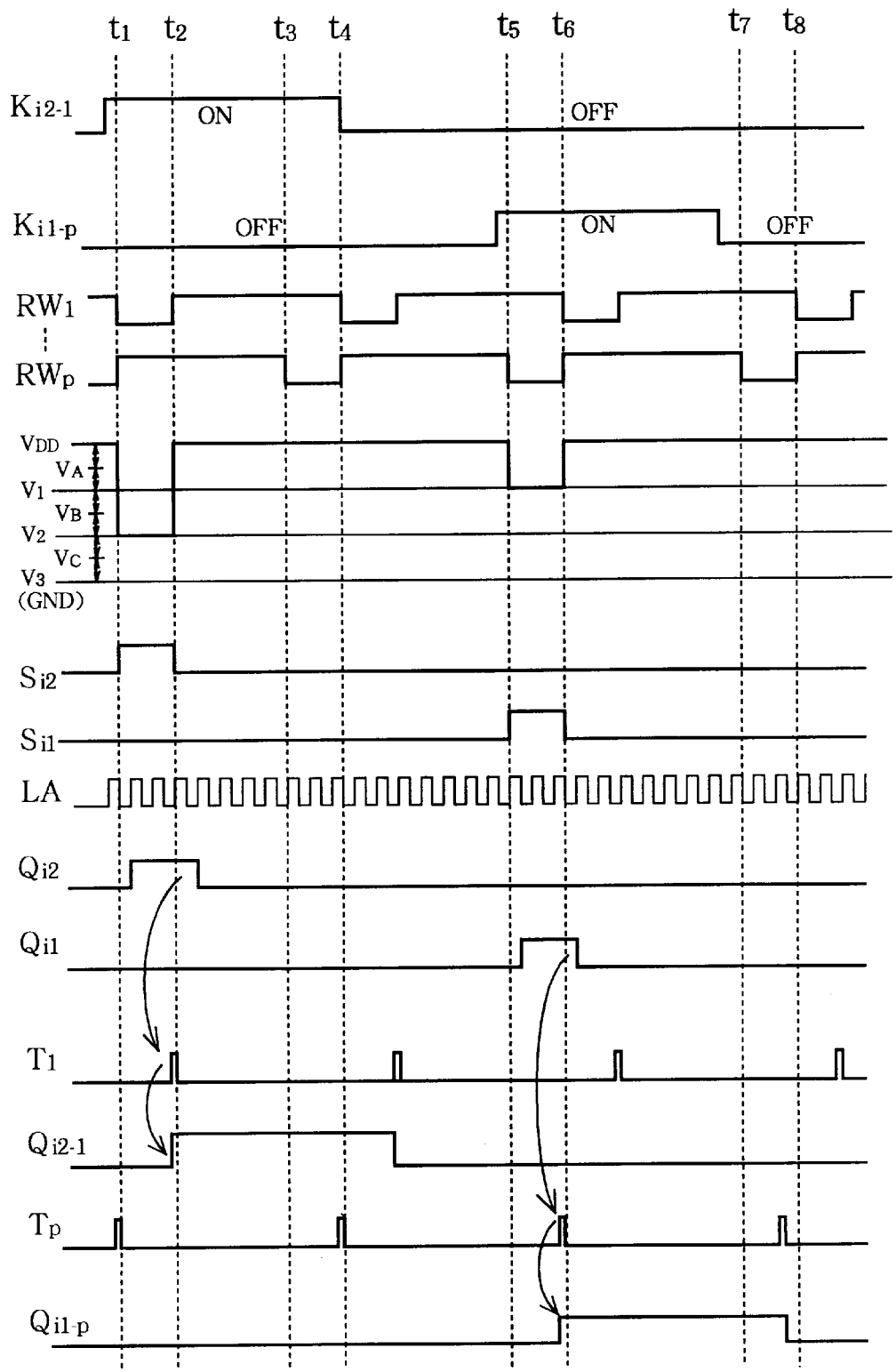
FIG. 9 is a timing diagram illustrating the operation of the second embodiment.

The operation of this dynamic key interface circuit 20 will be explained with reference to FIG. 9, taking as an example a case in which key switch $K_{i2-1}$ is closed, then opened, after which key switch $K_{i1-p}$ is closed, then opened, as indicated at the top of FIG. 9. Other key switches connected to input terminal $I_i$ are assumed to be open.

Each of the row driving pulse signals $TR_1$ to $TR_p$ is normally high. The timing generator 23 generates low row driving pulses in a cyclic sequence from $TR_1$ to $TR_p$. That is, first $TR_1$ is driven low; then $TR_1$ is driven high and $TR_2$ is driven low; then $TR_2$ is driven high and $TR_3$ is driven low, and so on. The row driver 21 generates similar row scanning signals at output terminals $RW_k$ ($1 \leq k \leq p$). The interval during which $RW_k$ is low is the scanning interval of row 1-k. FIG. 9 shows the waveforms at $RW_1$ and $RW_p$.

At the end of each scanning interval of row 1-k, the timing generator 23 drives the corresponding sub-latch pulse signal $T_k$ briefly high. FIG. 9 shows the waveforms of sub-latch pulse signals $T_1$ and $T_p$.

The latch pulse signal LA must go high at least once during each row scanning interval. As FIG. 9 indicates, LA may go high more than once during each row scanning interval.

In FIG. 9, the first row of key switches is first scanned by driving $RW_1$ low from time $t_1$ to time $t_2$. During this scanning interval, key switch $K_{i2-1}$ is closed, so the potential at input terminal $I_i$ is $V_2$, and result bit $S_{i2}$ is high. This high result is latched by the Latch circuit 7 at the first rising transition of LA during the scanning interval. The corresponding high output bit $Q_{i2}$ of the latch circuit 7 is latched by sub-latch circuit 22-1 when sub-latch pulse signal $T_1$ goes high at the end of the scanning interval. The corresponding sub-latch output bit $Q_{i2-1}$ goes high at this time.

During the next scanning interval of the first row, from time $t_3$ to time $t_4$, key switch $K_{i2-1}$ is open, the potential at input terminal $I_i$ is $V_{DD}$, the result signal $S_{i2}$ is low, and the corresponding latch output bit $Q_{i2}$ is low. The low $Q_{i2}$ level is latched by sub-latch circuit 22-1 when sub-latch pulse signal $T_1$ goes high again just before time $t_4$, causing the corresponding sub-latch output bit $Q_{i2-1}$ to return to the low level.

The p-th row is scanned in the same way from time $t_5$ to $t_6$, and again from time $t_7$ to time $t_8$. During the first of these scanning intervals, key switch $K_{i1-p}$ is closed, producing a potential of $V_1$ at input terminal $I_i$, causing result bit $S_{i1}$ and latch output bit $Q_{i2}$ to go high, and causing sub-latch output bit $Q_{i1-p}$ to go high in response to the sub-latch pulse $T_p$ just before time $t_6$. During the next scanning interval ($t_7$ to $t_8$), key switch $K_{i1-p}$ is open, the potential of input terminal $I_i$ is $V_{DD}$, $S_{i1}$ and $Q_{i1}$ are low, and sub-latch output bit $Q_{i1-p}$ returns to the low level at the sub-latch pulse $T_p$ just before time $t_8$.

The second embodiment increases the number of key switches that can be connected to a single key interface circuit by a factor of three times p, as compared with the conventional static key interface circuit shown in FIG. 7, and by a factor of three as compared with a conventional dynamic key interface circuit (not shown). The second embodiment is useful in apparatus having a very large number of key switches, provided the electromagnetic interference created by the row scanning signals output from terminals $RW_1$ to $RW_p$ can be tolerated.

The embodiments described above detect three input potentials $V_1$, $V_2$ and $V_3$, in addition to the power-supply potential $V_{DD}$, permitting three key switches to be connected to each input terminal $I_i$ in the first embodiment and three key switches per row to be connected to each input terminal $I_i$ in the second embodiment. In general, N key switches, or N key switches per row, may be connected to each input terminal $I_i$, where N is any integer greater than one, provided the first terminals of these N key switches can be biased at N different potentials.

Although the embodiments above have a plurality of input terminals $I_i$, the invention may be practiced in a key interface circuit with a single input terminal.

Various other modifications are possible in the embodiments above. The pull-up resistors can be replaced with pull-down resistors, for example, if the first terminals of the key switches are biased to $V_{DD}$, $V_1$, and $V_2$ instead of $V_1$, $V_2$, and $V_3$. In the second embodiment, the latch circuit 7 can be eliminated, and the result data $S_{ij}$ can be supplied directly to the sub-latch circuits. Alternatively, the sub-latch circuits can be eliminated, and the latch output data of the latch circuit 7 can be used directly as the output data of the key interface circuit, preferably with just one latch pulse LA per scanning interval.

Those skilled in the art will recognize that further variations are possible within the scope of the invention as claimed below.

What is claimed is:

1. A key interface circuit coupled to N key switches, where N is an integer greater than one, the key switches having respective first terminals and second terminals, the first terminals of the N key switches being biased at different potentials, comprising:

an input terminal coupled in common to the second terminals of the N key switches;

a multilevel detector coupled to said input terminal, for detecting a potential of said input terminal and generating corresponding result data;

a latch circuit coupled to said multilevel detector, for latching said result data, responsive to a latch pulse signal; and a timing generator coupled to said latch circuit, for generating said latch pulse signal.

2. The key interface circuit of claim 1, further comprising a biasing element coupled to said input terminal, for biasing said input terminal to a fixed potential different from the potentials of the first terminals of said N key switches, when said N key switches are all open.

3. The key interface circuit of claim 2, wherein said biasing element comprises a pull-up resistor through which said input terminal is coupled to a power-supply potential.

4. The key interface circuit of claim 2, wherein said biasing element comprises a pull-down resistor through which said input terminal is coupled to a ground potential.

5. The key interface circuit of claim 1, wherein said multilevel detector comprises:

a reference potential generator for generating a plurality of different reference potentials;

a comparing circuit, coupled to said reference potential generator, for comparing the potential of said input terminal with said different reference potentials and generating respective result signals; and a decoder, coupled to said comparing circuit, for decoding said result signals, thereby generating said result data.

6. The key interface circuit of claim 5, wherein said reference potential generator comprises a first resistor ladder.

7. The key interface circuit of claim 1, wherein the first terminals of said N key switches are biased by a resistor ladder.

8. A key interface circuit coupled to a matrix of key switches having N columns and P rows, where N and P are both integers greater than one, the key switches having respective first terminals and second terminals, the first terminals of the N key switches in each row being biased at different potentials when a first potential is supplied to said row, and being identically biased when a second potential is supplied to said row, comprising:

an input terminal coupled in common to the second terminals of all of said key switches;

a multilevel detector coupled to said input terminal, for detecting a potential of said input terminal and generating corresponding result data;

a row driver for supplying said first potential and said second potential selectively to each of said P rows, responsive to a timing signal; and a timing generator coupled to said row driver, for generating said timing signal.

9. The key interface circuit of claim 8, further comprising:

a latch circuit, coupled to said multilevel detector, for latching said result data, responsive to a latch pulse signal, thereby generating latch output data; and P sub-latch circuits, coupled to said latch circuit, for latching said latch output data, responsive to respective sub-latch pulse signals;

said latch pulse signal and said sub-latch pulse signals being generated by said timing generator.

10. The key interface circuit of claim 8, further comprising a biasing element coupled to said input terminal, for biasing said input terminal to a fixed potential different from the potentials of the first terminals of the N key switches in a row to which said row driver supplies said first potential, when said N key switches are all open.

11. The key interface circuit of claim 10, wherein said biasing element comprises a pull-up resistor through which said input terminal is coupled to a power-supply potential.

12. The key interface circuit of claim 10, wherein said biasing element comprises a pull-down resistor through which said input terminal is coupled to at ground potential.

13. The key interface circuit of claim 8, wherein said multilevel detector comprises:

a reference potential generator for generating a plurality of different reference potentials;

a comparing circuit, coupled to said reference potential generator, for comparing the potential of said input terminal with said different reference potentials and generating respective result signals; and a decoder, coupled to said comparing circuit, for decoding said result signals, thereby generating said result data.

14. The key interface circuit of claim 13, wherein said reference potential generator comprises a resistor ladder.

15. The key interface circuit of claim 8, wherein the first terminals of the N key switches in each said row are biased by a respective resistor ladder.

* * * * *